US006239465B1

United States Patent
Nakagawa

(10) Patent No.: US 6,239,465 B1
(45) Date of Patent: May 29, 2001

(54) NON-VOLATILE SEMICONDUCTOR MEMORY DEVICE HAVING VERTICAL TRANSISTORS WITH THE FLOATING AND CONTROL GATES IN A TRENCH AND FABRICATION METHOD THEREFOR

(75) Inventor: Shinichi Nakagawa, Suzuka (JP)

(73) Assignee: Fujitsu, Ltd., Kawasaki (JP)

( * ) Notice: Subject to any disclaimer, the term of this patent is extended or adjusted under 35 U.S.C. 154(b) by 0 days.

(21) Appl. No.: 09/391,353

(22) Filed: Sep. 8, 1999

(30) Foreign Application Priority Data

Jan. 27, 1999 (JP) .................................................. 11-019162

(51) Int. Cl.[7] .......................... H01L 29/788; H01L 29/76
(52) U.S. Cl. .......................... 257/331; 257/314; 257/315; 257/327; 257/328; 257/329; 257/330; 257/332; 438/201; 438/211; 438/212; 438/259; 438/268; 438/270; 438/271; 438/587; 438/588; 438/589
(58) Field of Search .................................... 257/327, 328, 257/329, 330, 331, 332, 314, 315, 316, 317

(56) References Cited

U.S. PATENT DOCUMENTS 6,093,606 * 7/2000 Liu et al. ............................. 438/259
6,147,378 * 11/2000 Liu et al. ............................. 257/316

* cited by examiner

Primary Examiner—Nathan Flynn
Assistant Examiner—Kevin Quinto
(74) Attorney, Agent, or Firm—Armstrong, Westerman, Hattori, McLeland & Naughton, LLP

(57) ABSTRACT

A non-volatile semiconductor memory cell array including an MOS transistor having a vertical channel along an inside wall of a trench in each cell is developed for high density integration and high speed operations. One aspect of the invention is that the trench is formed such that the first trench having an aperture is formed slightly deeper than a drain diffusion layer on a semiconductor surface whereas the second trench having a smaller aperture than that of the first trench is formed in a center of a bottom of the first trench extending depthwise to the buried source diffusion layer such that the peripheral width of an aperture section of the first trench in the drain area is larger than that of the second trench in the source area.

7 Claims, 21 Drawing Sheets

NON-VOLATILE SEMICONDUCTOR MEMORY DEVICE HAVING VERTICAL TRANSISTORS WITH THE FLOATING AND CONTROL GATES IN A TRENCH AND FABRICATION METHOD THEREFOR

BACKGROUND OF THE INVENTION

1. Field of the Invention

The present invention relates to non-volatile semiconductor memory devices, and more particularly, to a MOS-type semiconductor memory device which allows electrical writing and erasing, and a fabrication method therefor.

2. Description of the Related Air

FIG. 15 shows a cross-sectional structure of a memory cell in a conventional NOR-type flash memory. In FIG. 15, there are shown a p-type silicon semiconductor substrate 1, a field oxide film 2 having a thickness of about 400 nm to 800 nm, an oxide film 3 about 10 nm thick formed by thermally oxidizing the silicon semiconductor substrate, serving as a first gate insulating film of the non-volatile memory, a floating gate 4 made from a first polycrystalline silicon film, a second gate insulating film 5 about 20 nm thick, a control gate 6 made from a second polycrystalline silicon film, an impurity diffusion layer 7 having a conductivity type opposite to that of the substrate used for making a source diffusion layer have a high breakdown voltage, an n$^+$ diffusion layer for the source 8, an n$^+$ diffusion layer for the drain 9, a side-wall insulating film 10 for a gate electrode, an interlayer insulating film 11, a metal-wiring lead-out electrode 12 for the source, a metal-wiring lead-out electrode 13 for the drain, and a metal-wiring lead-out electrode 14 for the control gate. In a writing operation of the non-volatile semiconductor memory device having such a structure, a voltage is applied between the control-gate electrode 14 and the drain electrode 13 to generate an avalanche hot electron between the drain 9 and the substrate 1, and the electron is injected into the floating gate 4. In an erasing operation, a voltage is applied between the control-gate electrode 14 and the source electrode 12, and the electron is drawn from the floating gate 4 to the source 8 by Fowler-Nordheim tunneling (or F-N tunneling) current.

As scaling-down of an MOS transistor is further progressed to increase an integration scale of the MOS memory devices, the conventional memory cell will have no choice but encounter the following drawbacks:

(1) Since it is said that the lowest limit of a thin-film for a tunneling oxide film is about 8 nm thick in a memory cell using an F-N tunneling current, a scaling rule (a proportional reduction rule between a device dimension and a voltage to be applied, in scaling down) is not satisfied for a thin film having a film thickness less than that.

(2) When an effective channel length is made smaller by scaling-down, it is difficult to control a punch-through breakdown voltage and a leakage current.

(3) As capacitance of a capacitor coupled with the floating gate is reduced, erasing and writing characteristics deteriorate. These three drawbacks will be described below in detail.

FIG. 1 shows a capacitor model in a floating-type semiconductor memory cell. With this model, floating gate voltages Vfg(W) for writing and Vfg(E) for erasing can be expressed, respectively, as follows:

Writing $$Vfg(W)=(C_2 \cdot Vcg+C_3 \cdot Vd)/(C_1+C_2+C_3+C_4) \quad (1)$$

Erasing $$Vfg(E)=(C_2 \cdot Vcg+C_4 \cdot Vs)/(C_1+C_2+C_3+C_4) \quad (2)$$

where, $C_1$, $C_2$, $C_3$, and $C_4$ indicate the capacitance of capacitors formed between the floating gate 4 and the substrate 1, the control gate 6 and the floating gate 4, the floating gate 4 and the diffusion-layer drain 9, and the floating gate 4 and the diffusion-layer source 8, respectively, and Vcg, Vs, and Vd indicate the control gate voltage, the source voltage, and the drain voltage, respectively.

In general, to increase writing efficiency, since Vcg and Vd are both positive values, it is desirable that the capacitance of the capacitors $C_2$ and $C_3$ are made as large as possible in expression (1). Then, the effective voltage Vfg (W) applied to the floating gate increases and the injection efficiency of the avalanche hot electron into the floating gate, namely, writing efficiency, is improved. As a result, a writing time becomes short.

On the other hand, during erasing, since Vcg is zero or a negative value and Vs is a positive value, capacitance relationship of $C_2 \gg C_4$ is the most appropriate condition in expression (2). When this condition is satisfied, the effective voltage Vfg(E) applied to the floating gate increases. Therefore, the drawing efficiency of the electron from the floating gate to the source by the use of the F-N tunneling current, namely, erasing efficiency, is improved. As a result, an erasing period becomes short.

From the above reasons, when a device is scaled down finer only according to the scaling rule without changing the shape of MOS transistors, a range of choice in capacitance becomes narrower. Therefore, a non-volatile semiconductor memory device free from the above drawbacks in scaling-down has been demanded.

SUMMARY OF THE INVENTION

Accordingly, it is an object of the present invention to provide a non-volatile semiconductor memory device which allows the writing and erasing times to be reduced without lowering stability of the device characteristics due to the transistor scaling rule in highly integrated memory devices.

In a non-volatile semiconductor memory device according to the present invention, the inside wall surface of a trench formed in the depth direction of the semiconductor substrate serves as a device region in which the diffusion layers for source and drain, the floating-gate electrode, and the control-gate electrode are disposed so as to form a channel area in the depth direction. In addition, the trench is formed such that the peripheral width of the aperture of a vertical trench is made larger at the drain area in the upper portion than that at the source area in the lower portion.

According to the present invention, each of the memory cells is separated in the first direction on a plane of the semiconductor substrate surface by insulating walls (parallel to each other) extending in a second direction crossing the first direction on the same plane and extending in depth direction from an upper surface of the drain region to at least the lower surface of the source region, wherein the source diffusion layer is continuously extended over a series of the memory cells arranged in the second direction between each neighboring pair of the parallel insulating walls.

According to the present invention, the trench for the device region is formed such that the first trench having an aperture is formed on a semiconductor surface shallower than a source diffusion layer while the second trench having a smaller aperture than that of the first trench is formed in a center of a bottom of the first trench extending depthwise to the buried source diffusion layer such that the peripheral width of an aperture section of the first trench in the drain area is larger than that of the second trench in the source area.

According to the present invention, the trench for the device region is formed such that the inside wall of the first trench is concave while the inside walls of the second trench are essentially perpendicular to the plane of the semiconductor substrate surface.

BRIEF DESCRIPTION OF THE DRAWINGS

The present invention will be more apparent from the following description, when taken to conjunction with the accompanying drawings, in which.

DESCRIPTION OF THE PREFERRED EMBODIMENT

Figure 1:
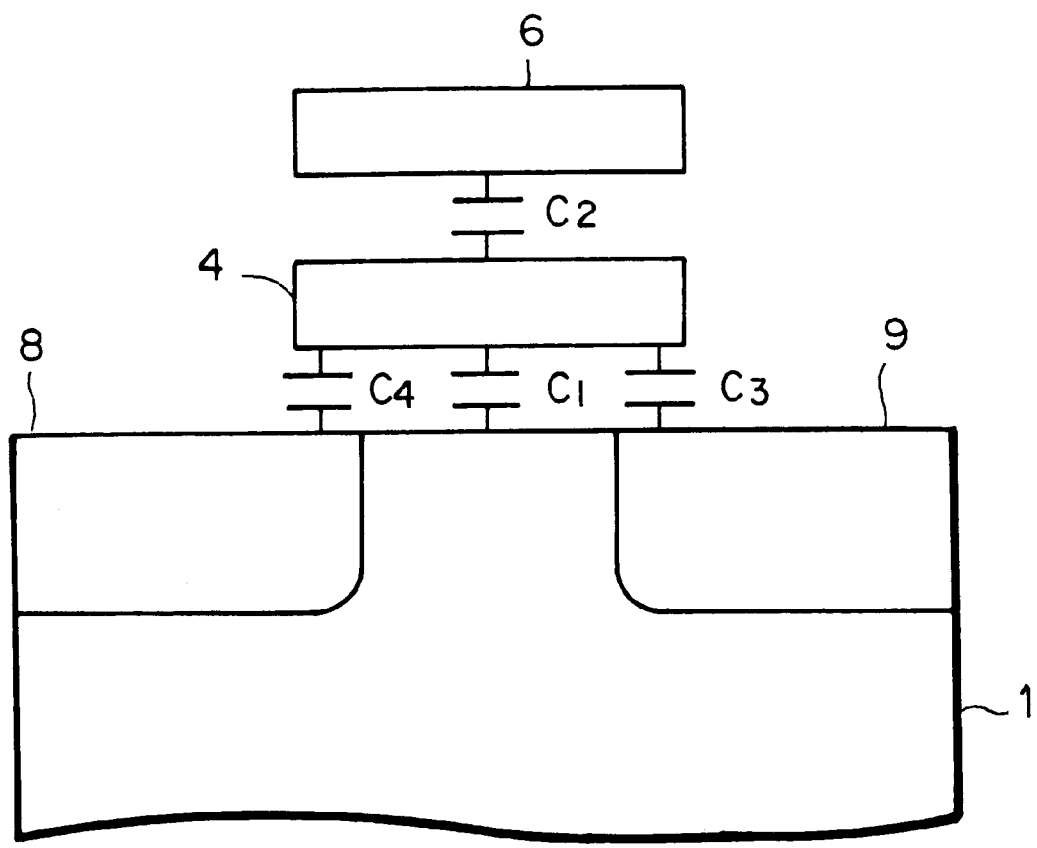
FIG. 1 shows a capacitor model in a floating-type semiconductor memory cell.
Figure 2:
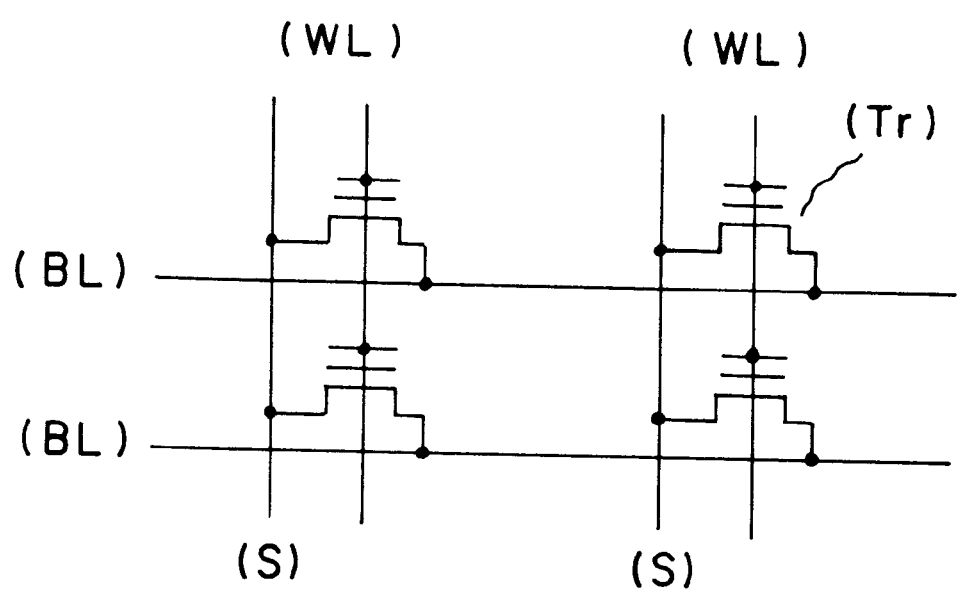
FIG. 2 is an equivalent circuit of a floating-type semiconductor memory cell array according to first to fifth embodiments of the present invention.

FIG. 2 shows an equivalent circuit of four-bits memory cells in a NOR-connection-type flash memory cell array formed of floating-type semiconductor memory cells (Tr's) disposed at intersections of bit lines (BL's) and word lines (WL's) and having common sources (S's).

Figure 3:
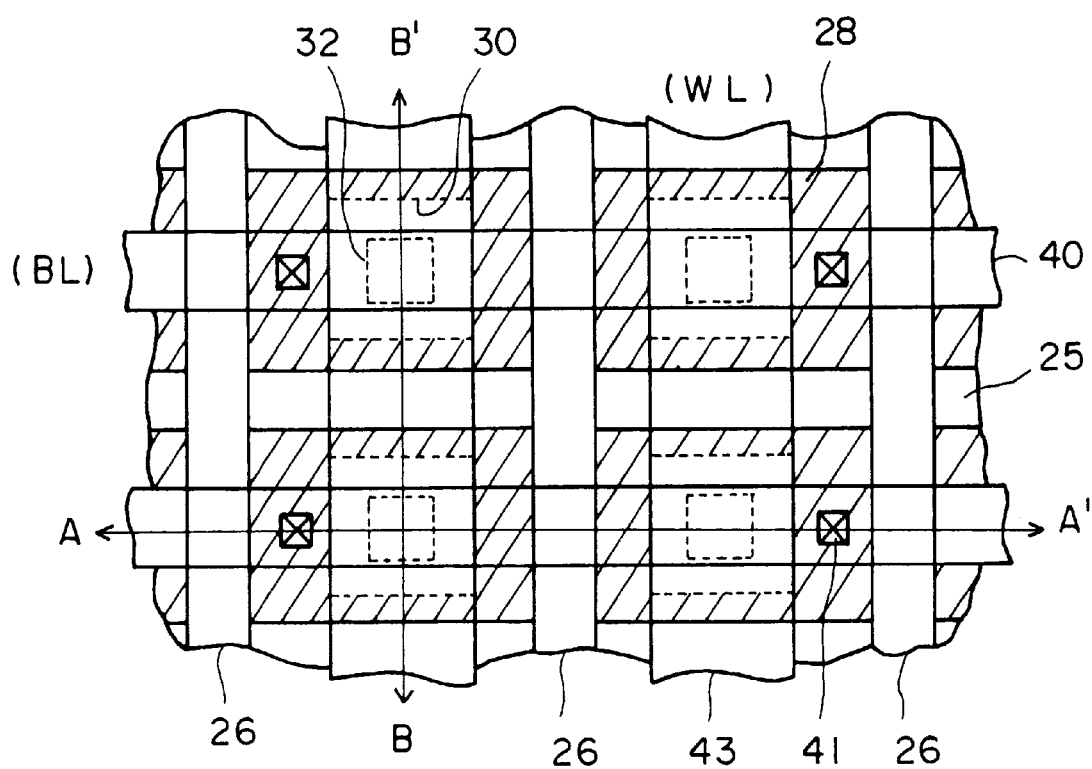
FIG. 3 is a top view corresponding to FIG. 2.

FIG. 3 is a top view of the portion shown in FIG. 2 in the memory-cell array according to the present invention. Each of the semiconductor device is arranged in series with separation in the word-line (WL) direction while they are insulated by trench-type insulating walls (trench isolation) 26 disposed in parallel at an equal interval in the bit-line (BL) direction. Floating-type semiconductor memory cells (Tr's) are formed such that buried source diffusion layers extended in the word-line (WL) direction are formed on the whole semiconductor device areas between trench-type insulating walls, which are extended in the depth direction from the surface of an epitaxial layer 25 to the semiconductor substrate 21. First and second trenches 30 and 32 are formed so as to pass through the epitaxial layer 25 which are the drain diffusion layer 28 and the channel regions 25, extending to the source diffusion layer 24. The trenches are filled with first gate insulating film (or a tunneling oxide film) 33, a floating gate 34, the second gate insulating film 36, and a control gate 38. The channels are formed at inside walls between the drain diffusion layer 28 and the source diffusion layer 24. The bit lines (BL's) 40 are connected to the drain diffusion layers 28 by drain lead-out electrodes 41, and the word lines (WL's) 43 are connected to control gate electrodes 38. Cross-sectional planes A—A' and B—B' are along a bit line (BL) 40 and a word line (WL) 43, respectively, and are referred to in the following processes.

Embodiment 1

Figure 4A:
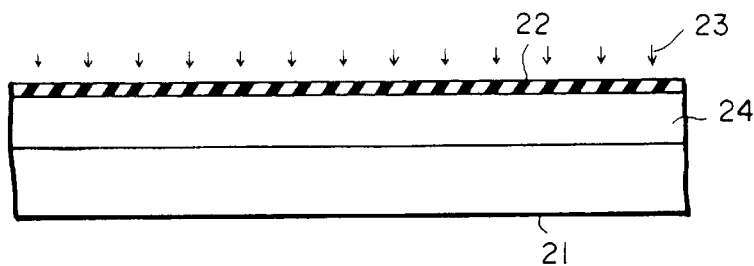
FIGS. 4A–4J are cross sections on a line A—A' in FIG. 3 of the floating-type semiconductor memory cell array according to the first embodiment, which show fabrication processes of the memory cell array.
Figure 4B:
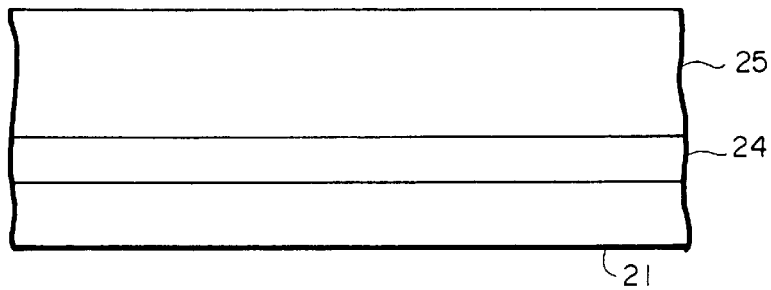
Figure 4C:
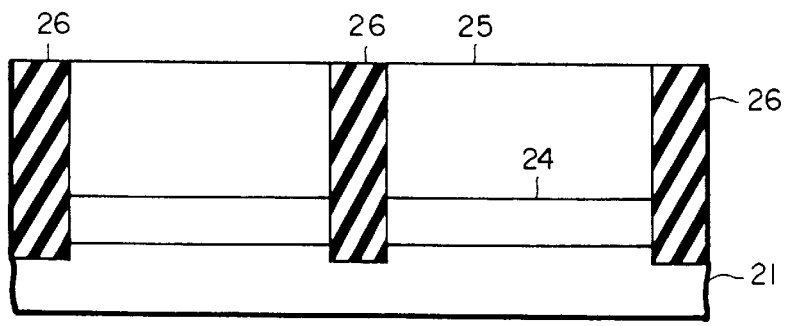
Figure 4D:
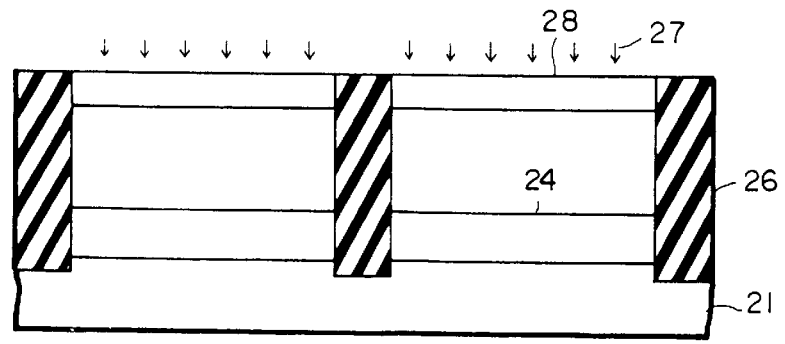
Figure 4E:
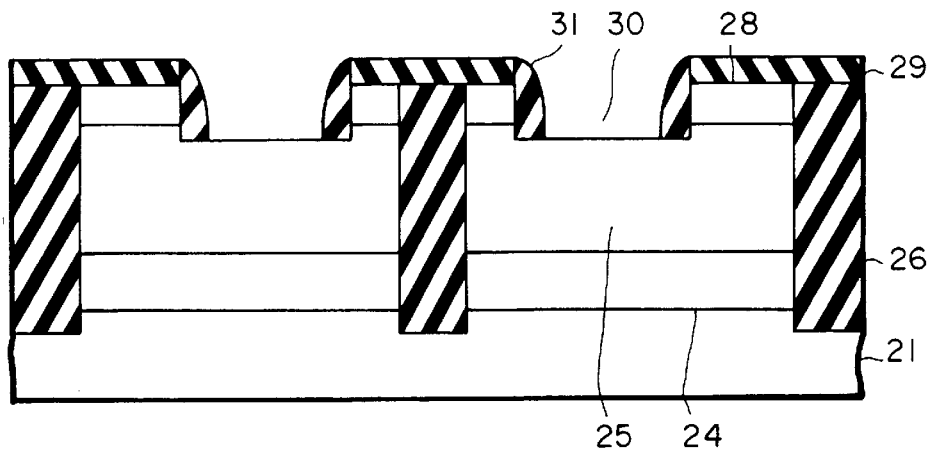
Figure 4F:
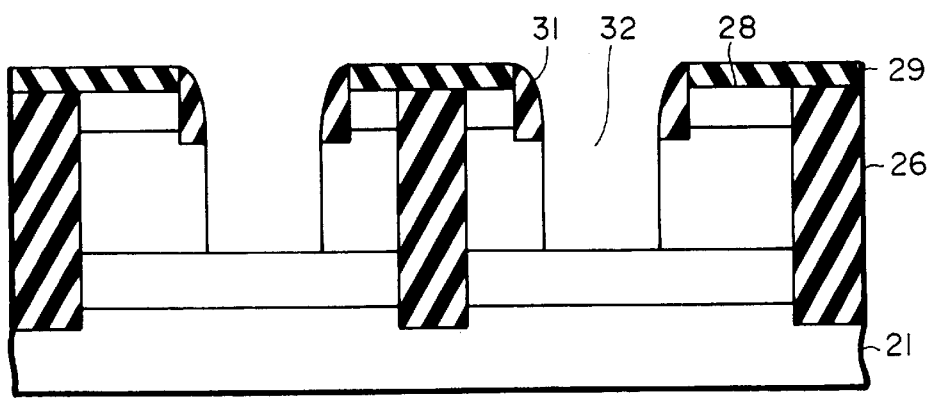
Figure 4G:
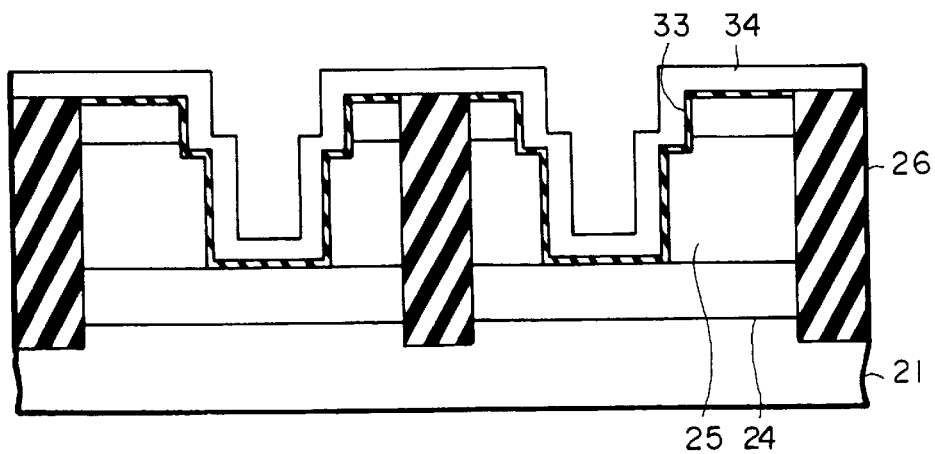
Figure 4H:
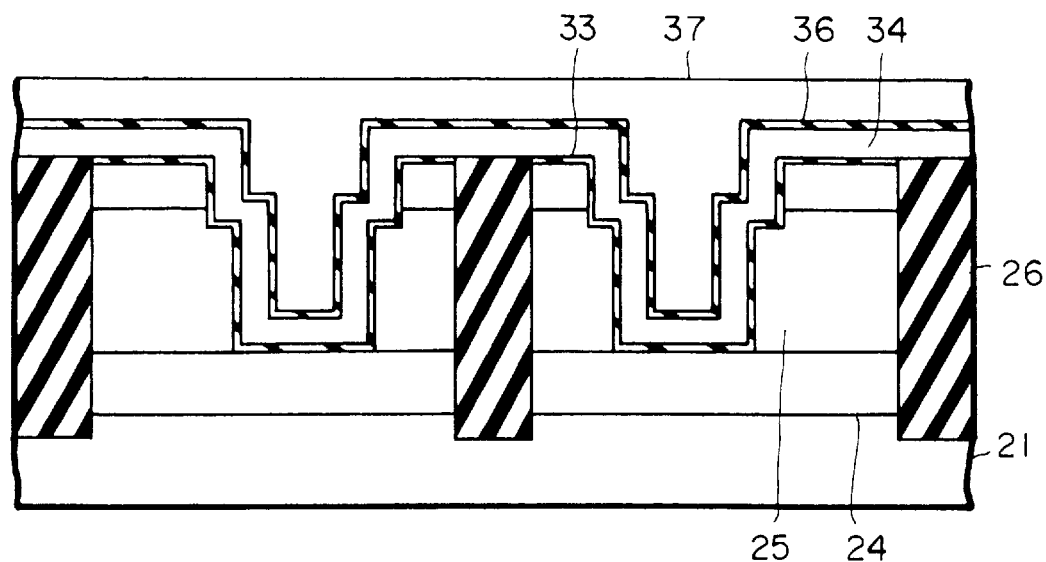
Figure 4I:
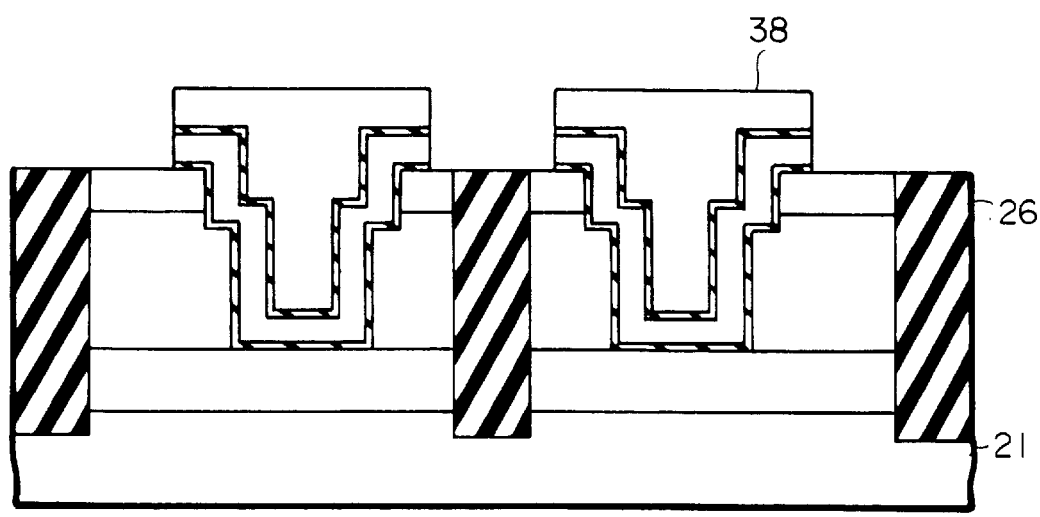
Figure 4J:
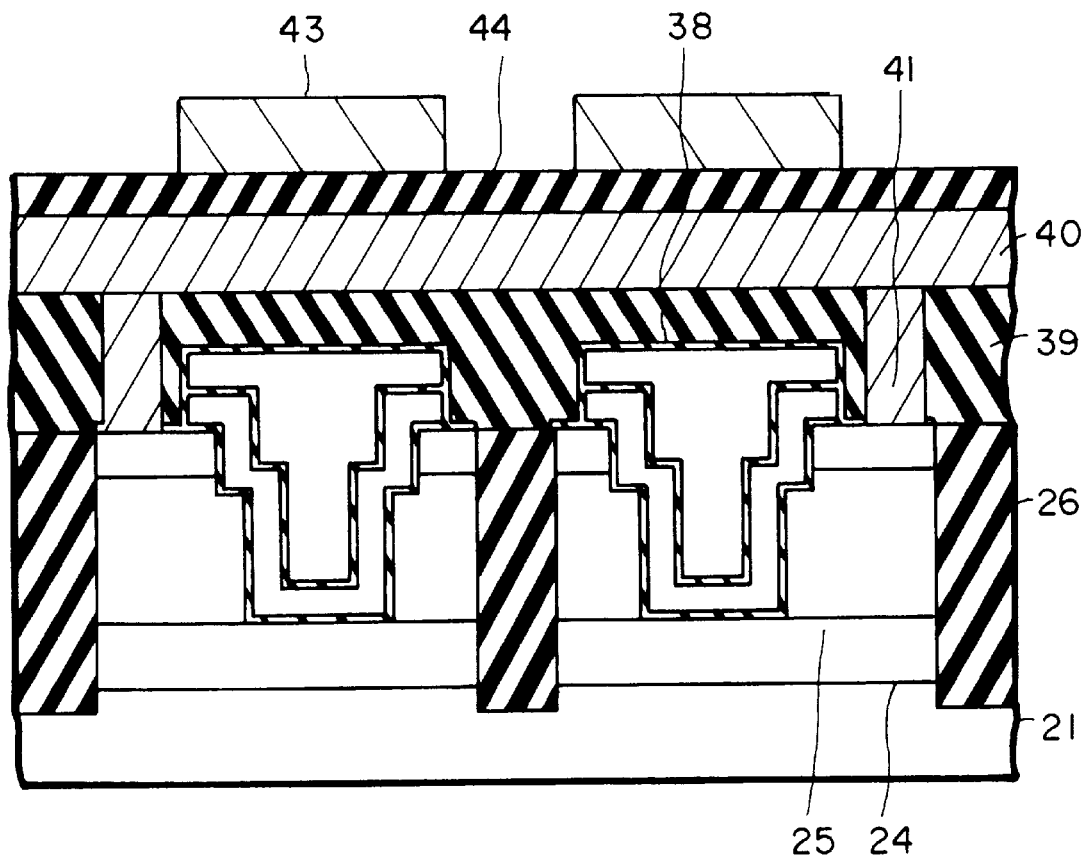
Figure 5:
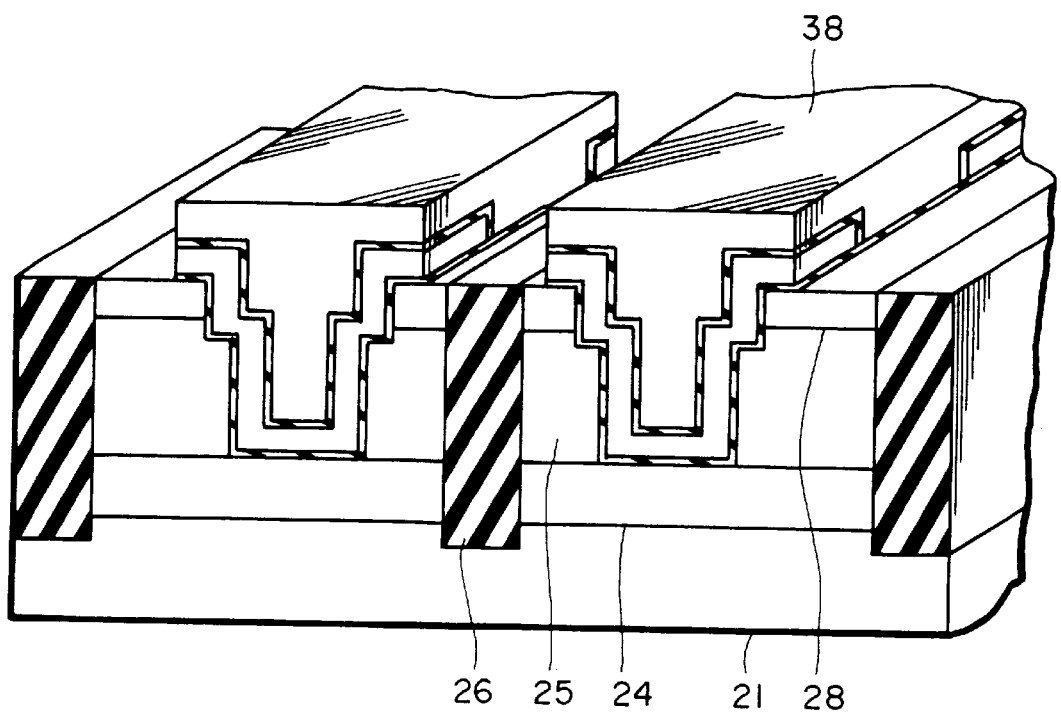
FIG. 5 is a cross-sectional perspective view on the line A—A' in FIG. 3 of the memory cell array in a processing step shown in FIG. 4I in the first embodiment.
Figure 6:
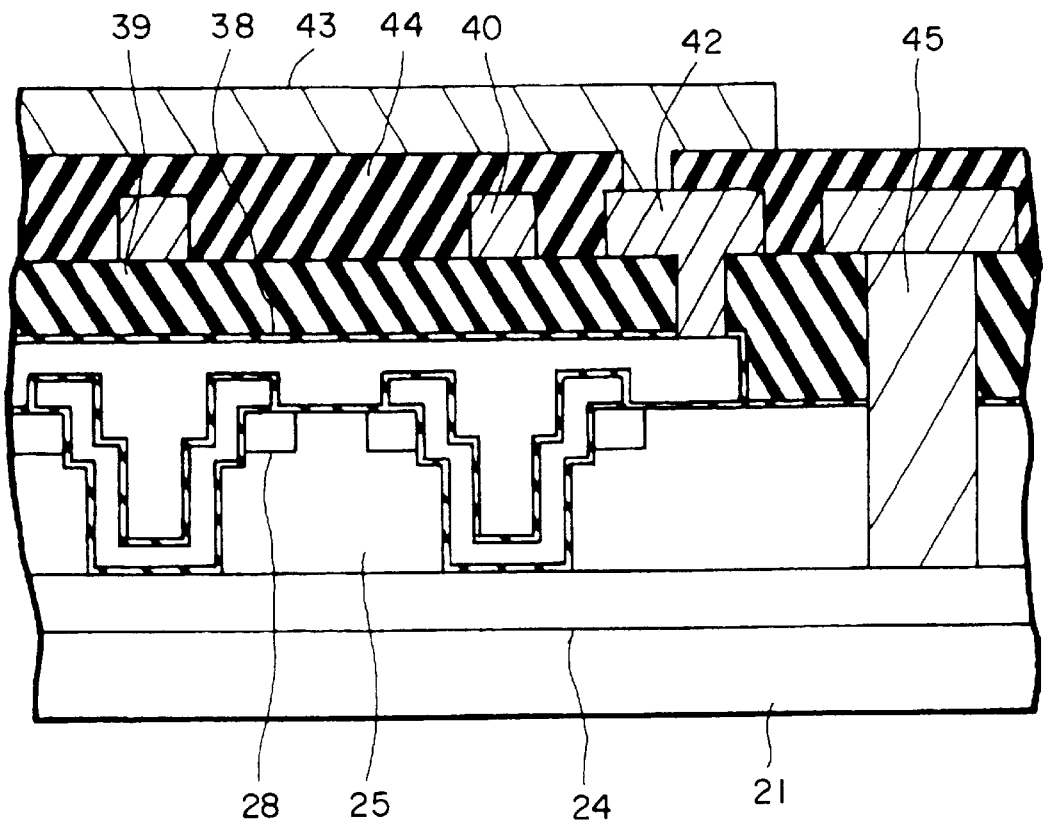
FIG. 6 is a cross-sectional view on a line B—B' in FIG. 3 of the memory cell array in a processing step shown in FIG. 4J in the first embodiment.

FIGS. 4A–4J, 5 and 6 show a non-volatile semiconductor memory device according to the first embodiment of the present invention. FIGS. 4A–4J are device cross-sections at fabrication processes, FIG. 5 is a device cross-sectional perspective view at a step of the fabrication processes, and FIG. 6 is a device cross-section at the final process along a different direction from that of the FIGS. 4A–4J.

As shown in FIG. 4A, as so called "a through film" for preventing a damage and contamination on a p-type semiconductor substrate 21 in ion implantation, an oxide film 22 about 10 nm thick is formed on a bare silicon surface by thermal oxidation. Ion implantation is then performed with arsenic ions ($As^+$) 23 at an acceleration voltage of 60 keV and an dose amount of $3.0 \times 10^{15}$ dose/cm². Annealing is applied at 900° C. for activation, an $n^+$ diffusion layer 24 which can be a source area is formed, and the oxide film 22 is removed.

A p-type epitaxial layer 25 having a thickness of 1 μm is grown on the $n^+$ diffusion layer 24 formed on the p-type semiconductor substrate as shown in FIG. 4B. Since the channels of vertical MOS transistors are to be formed in the p-type epitaxial layer 25, the impurity concentration and the film thickness thereof are determined according to the breakdown voltage between the sources and the drains of the MOS transistors and the channel length thereof.

As shown in FIG. 4C, an insulating film such as a nitride film ($Si_3N_4$ 200 nm thick) is grown on the whole surface of the epitaxial layer 25, and a pattern (at positions indicated by 26 in FIG. 3) having narrow windows only on the device separation areas parallel to the word lines (43 in FIG. 3) is formed by a photolithography technology. Silicon (Si) is vertically etched with this pattern serving as a mask to form trenches 1.5 μm deep in the device separation areas. The bottom of the trenches are deeper than the lower part of the buried $n^+$ diffusion layer 24 and the trenches completely separate the n$^+$ diffusion layer 24. The trenches are then filled back with oxide films by a usual method of chemical vapor deposition and etch back processes to form trench-type insulating walls (trench isolation) 26. The source n$^+$ diffusion layer 24 is separated in a strip manner from each other by the trench-type insulating walls 26. Before the trenches are filled with the oxide films, ion implantation is performed at such an angle from the vertical side wall that p$^+$ diffusion layers (not shown) for channel cut along the side walls and the bottoms of the trenches are formed, that is, on surfaces of the p-type epitaxial layer 25 and the p-type substrate 21 with which the trench-type insulation 26 is in contact.

A pattern is formed on a mask such as a resist by a photolithography technology, and ion implantation is selectively performed with arsenic ions (As$^+$) 27 on the surface of the p-type epitaxial layer 25 to form drain areas (28 in FIG. 3) separated for each memory cell, as shown in FIG. 4D. Boron ions (B$^+$) are implanted into each separation area between drain areas adjacent to each other in the word-line direction to form channel cuts which prevent a parasitic channel.

With an insulating film 29 such as a nitride film ($Si_3N_4$ 150 nm thick) being used as a mask, a first trench 30 deeper than the drain n$^+$diffusion layer 28 is formed almost at the center of each device area by anisotropic etching, as shown in FIG. 4E. An oxide film ($SiO_2$ 150 nm thick by CVD) is deposited on the whole surface of the first trench, and then the flat portion of the oxide film is removed by anisotropic etching to form a side-wall insulating film 31 only at the side wall of the first trench.

With the side-wall insulating film 31 and the insulating film 29 being used as masks, a second trench 32 reaching the source n$^+$ diffusion layer 24 is formed at the center of the first trench 30 by anisotropic etching, as shown in FIG. 4F.

As shown in FIG. 4G, the side-wall insulating film 31 and the insulating film 29 are removed. A tunneling oxide film 33 ($SiO_2$ 10 nm thick) is grown on the entire surface of the exposed silicon (Si), that is, the top surface of the drain region 28, inside walls and bottoms of the first and second 30, 32, respectively, by thermal oxidation. A polycrystalline silicon film 34 (poly-Si 100 nm thick) doped with phosphorus, to be used as a floating gate electrode, is deposited on the tunneling oxide film 33, and then strip patterns which cover the upper portions of the second trenches 32 and are separated by the device areas in the word-line (WL) direction, are formed by the photolithography technology.

As shown in FIG. 4H, interlayer insulating films 36 (thermal $SiO_2$ or laminated films of thermal $SiO_2$ and CVD $Si_3N_4$, with a film thickness of 20 nm) are grown on the strip-shaped polycrystalline silicon films 34. Then, a polycrystalline silicon film 37 doped with phosphorus (or a high-melting-point metal) is formed so as to make the trenches flat to be used as a control gate electrode, in which a high-melting-point metal or refractory metals are such as tungsten (W), cobalt (Co), tantalum (Ta), molybdenum (Mo), or titanium (Ti), or one of silicides with these high-melting-point metals such as tungsten silicide ($WSi_2$), cobalt silicide ($CoSi_2$), tantalum silicide ($TaSi_2$), molybdenum silicide ($MoSi_2$), or titanium silicide ($TiSi_2$), or a two-layer structure of a polycrystalline silicon film doped with phosphorus and a metal silicide film, or a sandwiched structure in which a barrier metal such as titanium nitride (TiN) is sandwiched by a polycrystalline silicon film doped with phosphorus and a high-melting-point metal.

Strip patterns which cover the upper portions of the second trenches 32, which separate and cut the upper and lower polycrystalline silicon films 34 and 37 and the interlayer insulating film 36 in each device area in the bit-line (BL) direction, and in which the polycrystalline silicon films 37 are extended in the word-line (WL) direction are formed by the photolithography technology as shown in FIG. 4I. FIG. 5 is a cross-sectional perspective view of the semiconductor memory device in this condition.

An oxide film ($SiO_2$ 100 nm thick) and a first interlayer insulating film 39 (BPSG 900 nm thick) are formed on the exposed silicon surface, as shown in FIG. 4J. Then, a pattern of the bit lines (BL) 40 and a contact 41 for the drain diffusion layer 28, and a second interlayer insulating film 44 are deposited. A wiring 43 for reducing the resistance of the control gate is formed. FIG. 6 is a cross-sectional view on the cross-sectional plane B—B', along each of the word lines (WL) 43. A lead-out electrode 42 for the control gate 38 and a lead-out electrode 45 for the source diffusion layer are formed. Although not shown, a cover layer for passivation is deposited on the whole surface of the wafer, and contact holes for bonding pads are formed to complete the wafer process.

Embodiment 2

A second embodiment of the present invention will be described below by referring to FIGS. 7G–7J, 8 and 9.

Figure 7G:
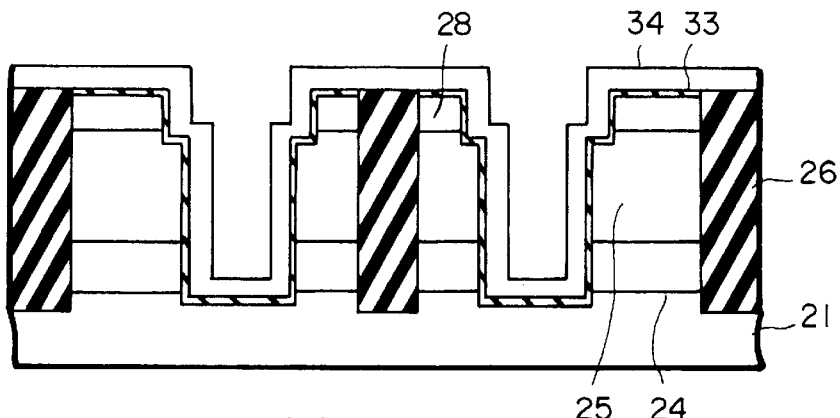
FIGS. 7G–7J are cross sections on the line A—A' in FIG. 3 of the floating-type semiconductor memory cell array according to the second embodiment, which show fabrication processes of the memory cell array.
Figure 7H:
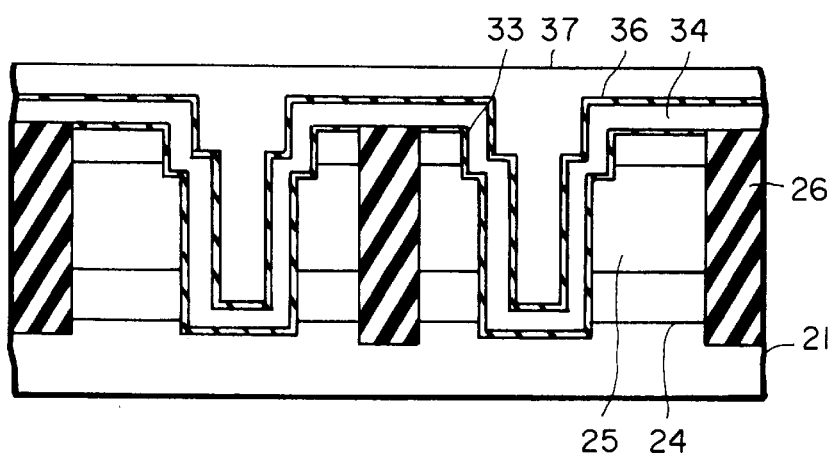
Figure 7I:
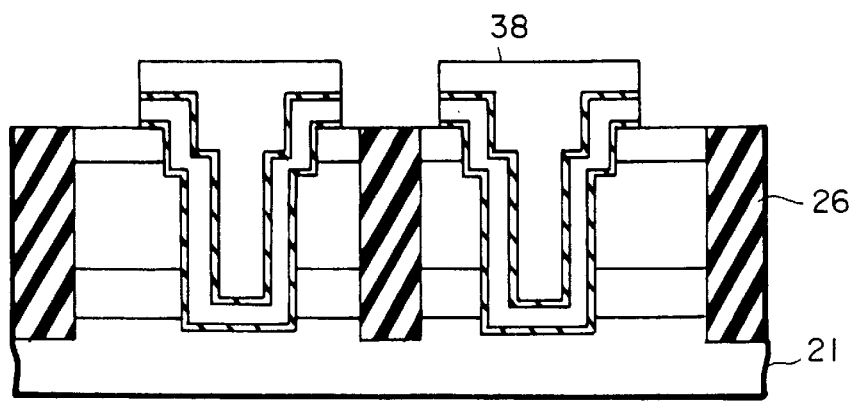
Figure 7J:
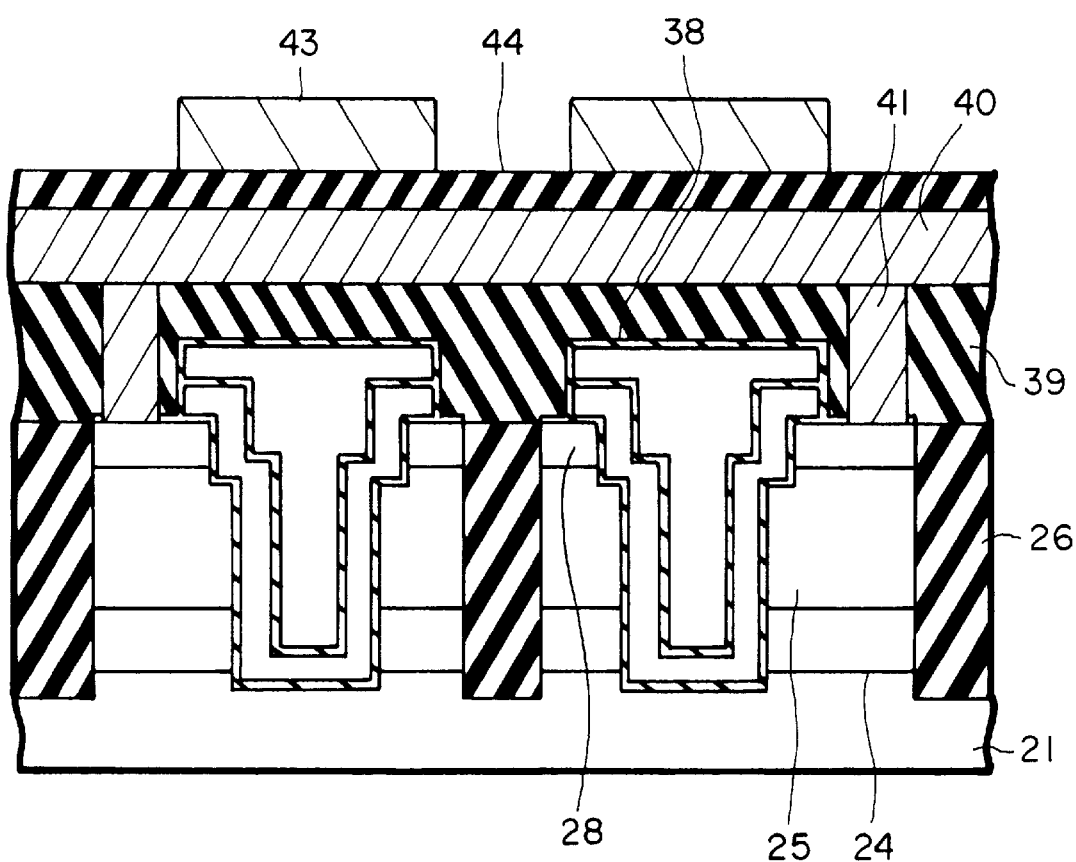
Figure 8:
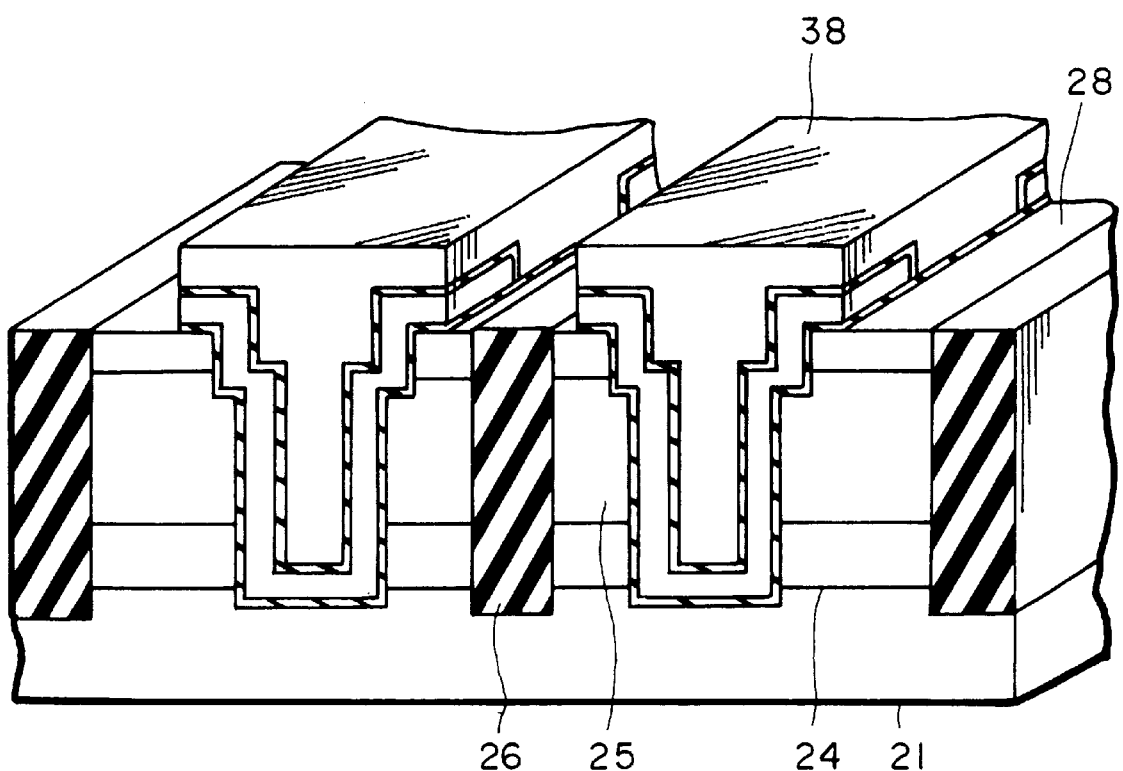
FIG. 8 is a cross-sectional perspective view on the line A—A' in FIG. 3 of the memory cell array in a processing step shown in FIG. 7I in the second embodiment.
Figure 9:
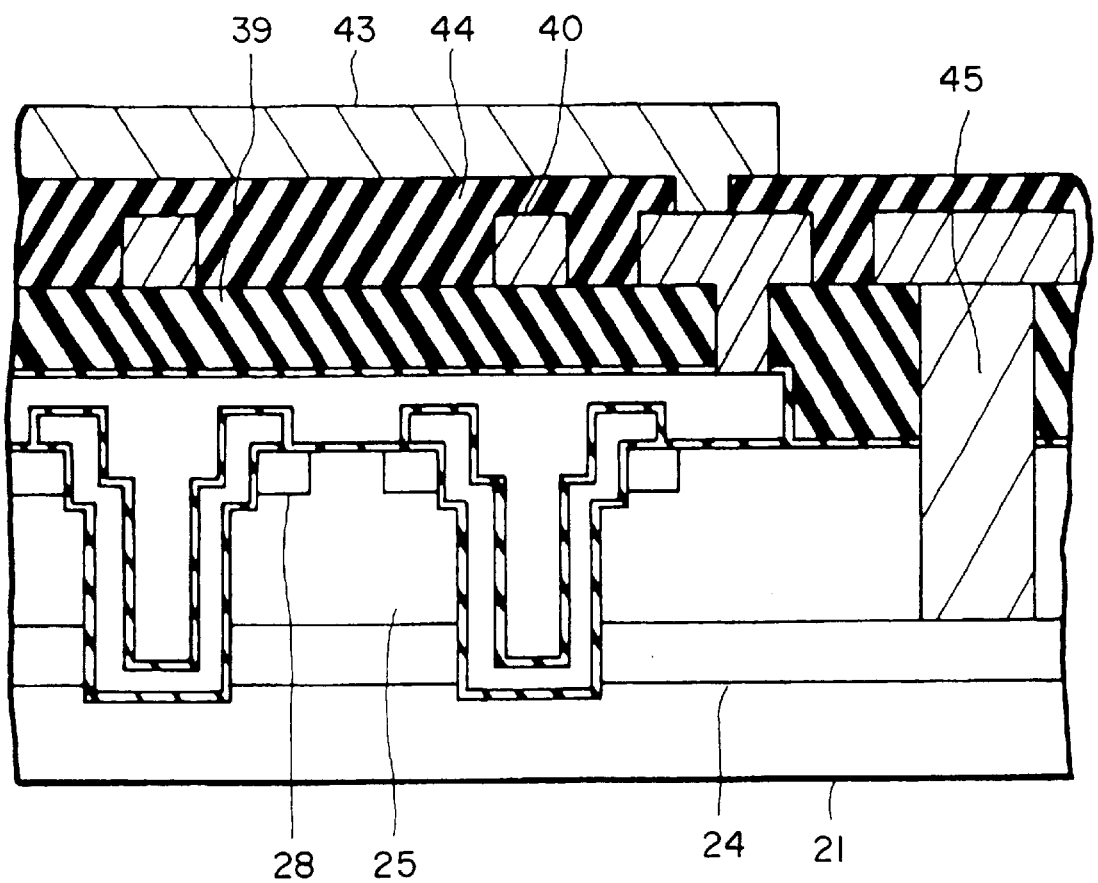
FIG. 9 is a cross-sectional view on the line B—B' in FIG. 3 of the memory cell array in a processing step shown in FIG. 7J in the second embodiment.

Since the processing steps for the second embodiment up to the step of forming the first trench 30 are exactly the same as those for the first embodiment as shown in FIGS. 4A–4E, the descriptions and drawings thereof are omitted. The wafer processing steps start at the step immediately before the second trenches are formed by etching. The second embodiment differs in structure from the first embodiment in that the second trenches 32 pass through the buried source diffusion layer 24 and reach the semiconductor substrate 21 therebelow in the second embodiment, as shown in FIG. 7G, whereas in the first embodiment, the second trenches 32 reach the buried source diffusion layer 24 and stop there, as shown in FIG. 4F. In a fabrication method, the time for anisotropic etching for the silicon needs to be extended by a period of time corresponding to the depth difference. Processing steps to be performed after the second trenches 32 are formed are essentially the same as those in the first embodiment. The processing steps in FIGS. 7H–7J, 8 and 9 can be understood correspondingly to FIGS. 4H–4J, 5 and 6. Whether the first embodiment or the second embodiment is more advantageous in device characteristics depends on the capacitance of the capacitor $C_4$ mainly determined by the overlapping area of the source diffusion layer 24 and the first gate oxide film 33, and the increase of the capacitance of the capacitor $C_1$ determined by the overlapping area of the semiconductor substrate 21 and the first gate oxide film 33.

Embodiment 3

A third embodiment of the present invention will be described below by referring to FIGS. 10E–10J, 11 and 12.

Figure 10E:
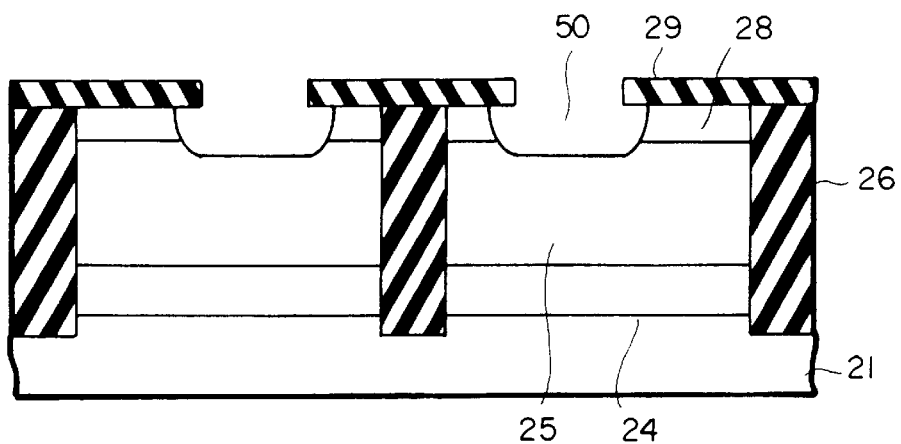
FIGS. 10E–10J are cross sections on the line A—A' in FIG. 3 of the floating-type semiconductor memory cell array according to the third embodiment, which show fabrication processes of the memory cell array.
Figure 10F:
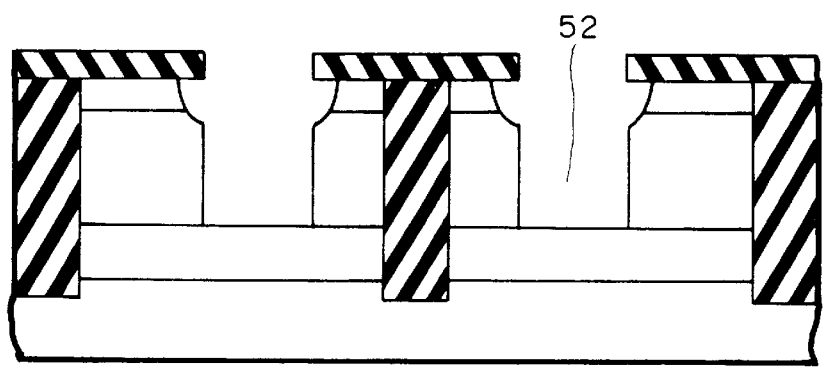
Figure 10G:
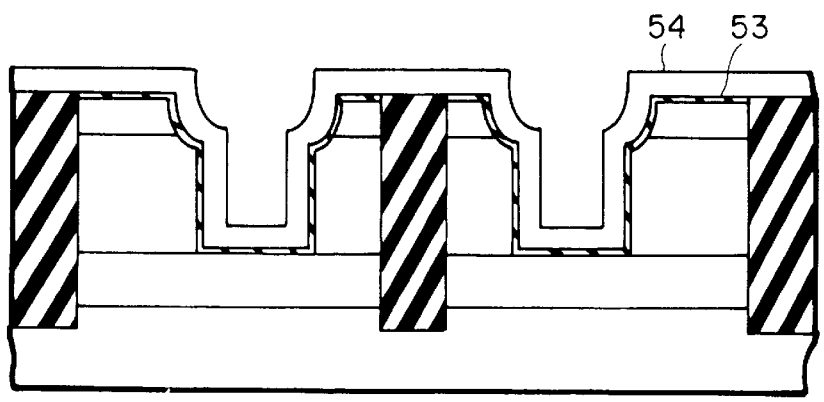
Figure 10H:
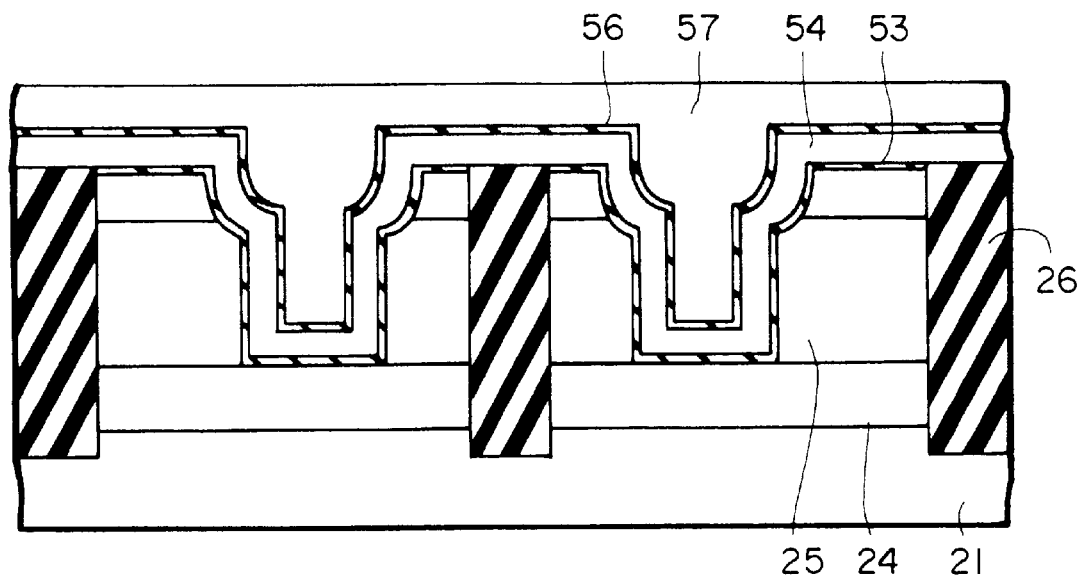
Figure 10I:
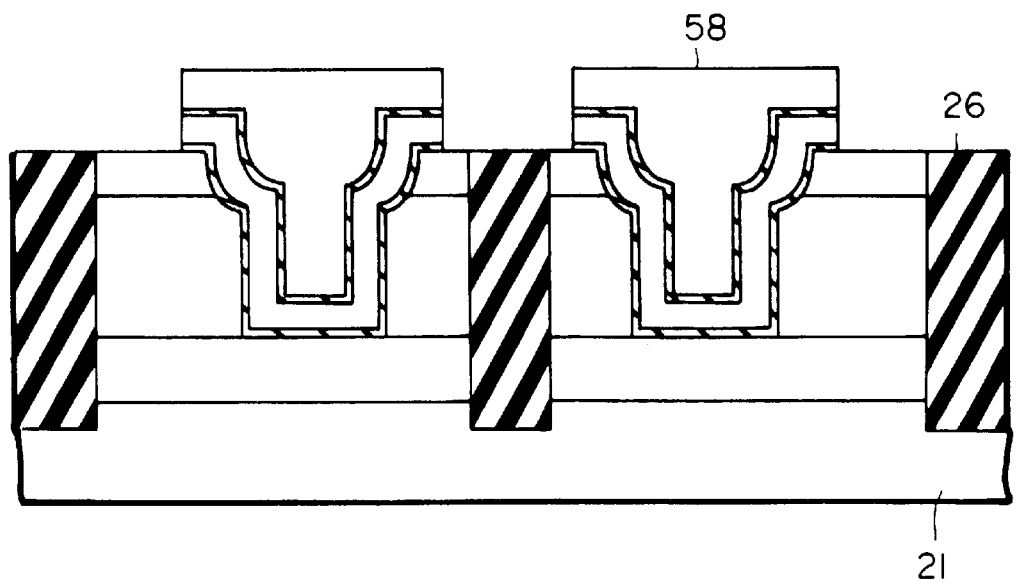
Figure 10J:
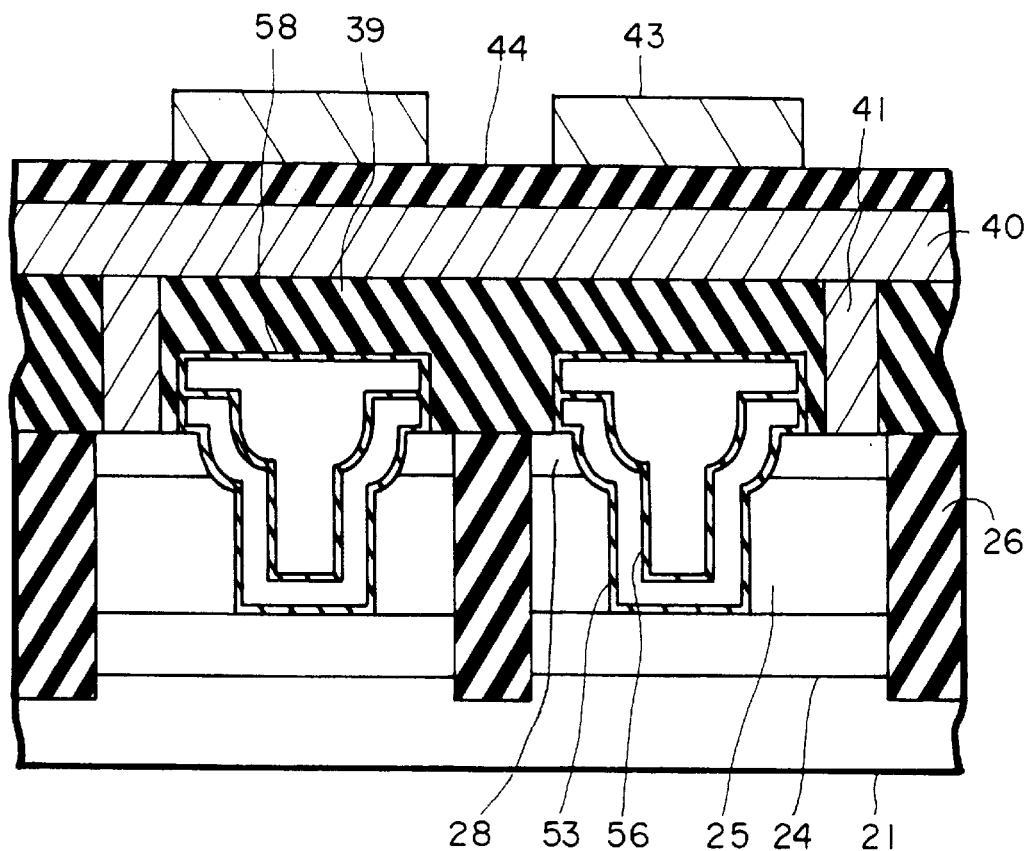
Figure 11:
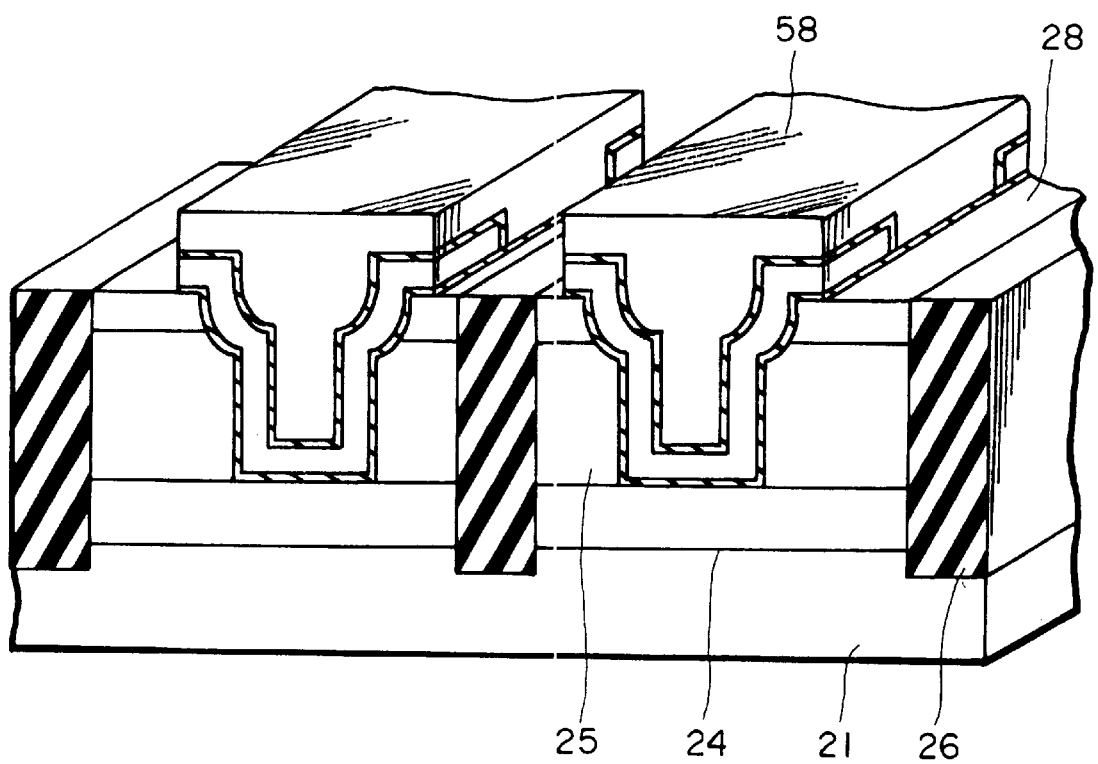
FIG. 11 is a cross-sectional perspective view on the line A—A' in FIG. 3 of the memory cell array in a processing step shown in FIG. 10I in the third embodiment.
Figure 12:
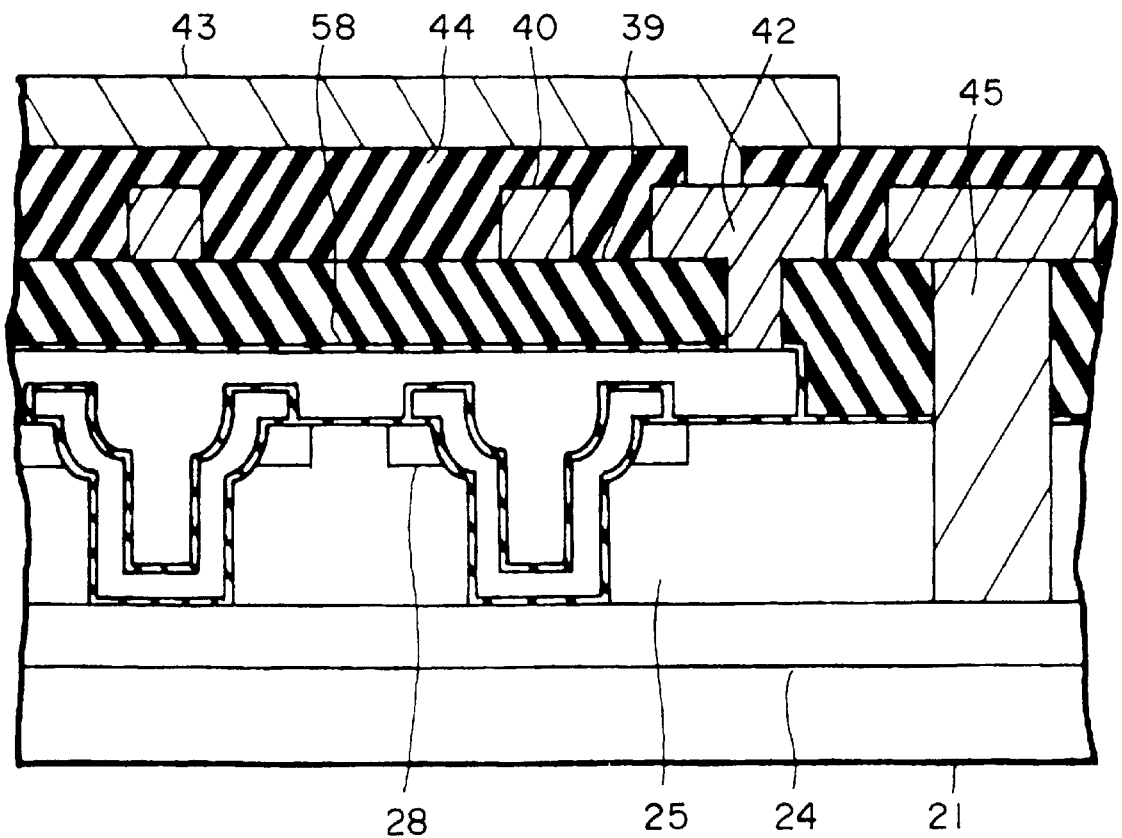
FIG. 12 is a cross-sectional view on the line B—B' in FIG. 3 of the memory cell array in a processing step shown in FIG. 10J in the third embodiment.

Since the processing steps for the third embodiment up to the step of depositing an insulating film 29 are exactly the same as those for the first embodiment, the descriptions and drawings thereof are omitted. The wafer processing steps start at the step immediately before the insulating film 29 is patterned as a mask for photolithography to form the first trench 50 by etching. The third embodiment differs in structure from the first embodiment in that a first trench 50 has a curved side wall by isotropic etching for the silicon, as shown in FIG. 10E, whereas in the first embodiment, the first trench 30 has a vertical side wall made by anisotropic etching for the silicon, as shown in FIG. 4E. Since an overhang is generated under an end of the etching mask (insulating film) 29 by isotropic etching, it is necessary to design the aperture of the etching mask (insulating film) 29 so as to be smaller than the aperture of the first trench 50. As shown in FIG. 10F. Anisotropic etching is again performed for the silicon with the same etching mask to form a second trench 52 having a vertical side wall. The second trench 52 reaches the buried source diffusion layer 24 at the bottom and stops there. Since the second trench 52 can be formed by anisotropic etching immediately after the first trench is formed by isotropic etching by the use of the same etching mask, the process is simplified. Processing steps to be performed after the second trench 52 is formed are essentially the same as those in the first embodiment, the descriptions thereof are omitted.

Embodiment 4

Figure 13:
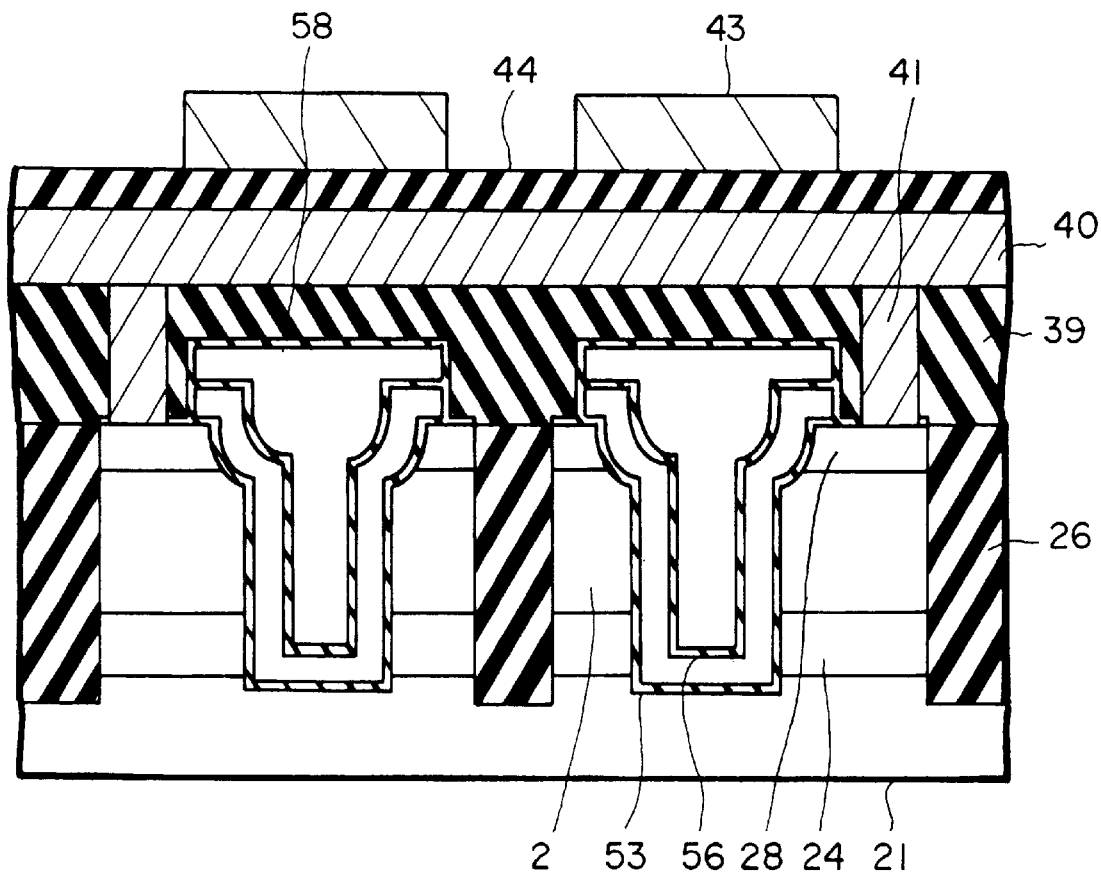
FIG. 13 is a cross section on the line A—A' in FIG. 3 of the floatingtype semiconductor memory cell array according to the fourth embodiment in a processing step corresponding to the process shown in FIG. 10J in the third embodiment.

A fourth embodiment of the present invention will be described below by referring to FIG. 13.

As for a structure in the fourth embodiment, a first trench has a curved side wall by isotropic etching in the same way as in the third embodiment and a second trench passes through the buried source diffusion layer 24 and reaches the semiconductor substrate 21 therebelow in the same way as in the second embodiment. Therefore, since the wafer process from the start to the step immediately before the second trenches are formed by etching are essentially the same as those in the third embodiment. The second trench is formed essentially the same way as in the second embodiment. Thus, the descriptions and drawings thereof are omitted.

In the first to the fourth embodiments, the first trench is deeper than the drain diffusion layer 28. This is not a necessary condition of the present invention. As the feature size of a device has been reduced, the fabrication technology of shallow drain diffusion layers has generally become mature. On the contrary, the first trench shallower than the drain diffusion layers is not necessarily easily formed. Therefore, when a drain diffusion layer is extremely shallow, it is advantageous in the viewpoint of reducing the fluctuation of device characteristics that the first trench is designed to be deeper than the drain diffusion layer.

Embodiment 5

Figure 14:
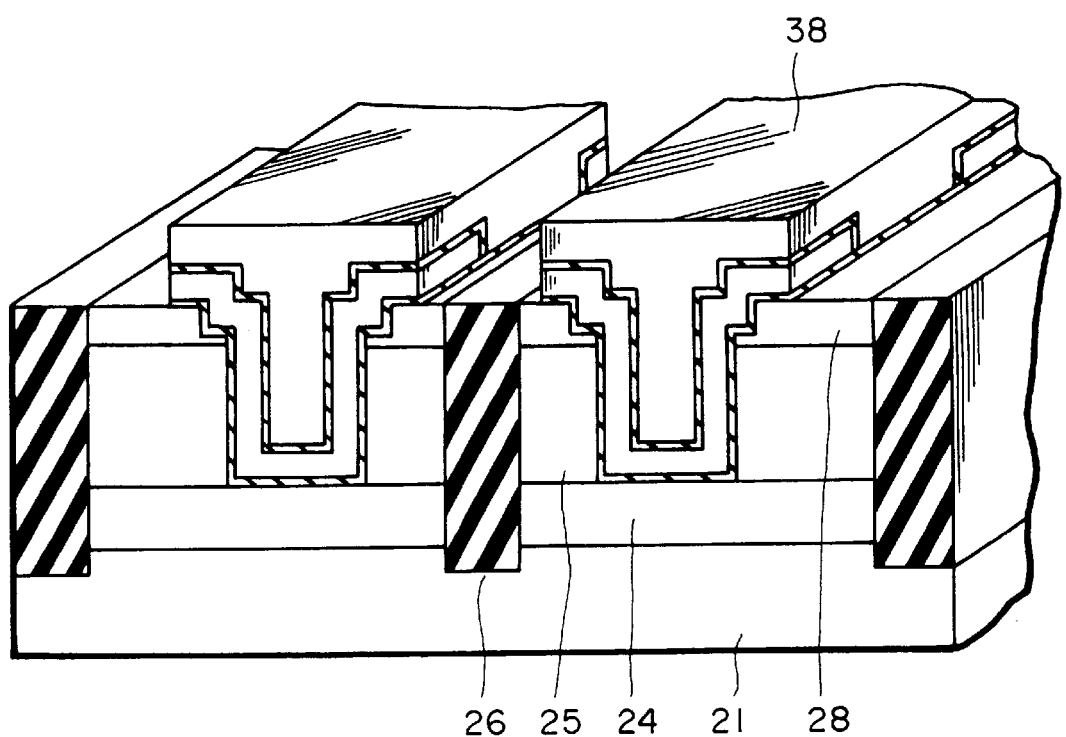
FIG. 14 is a cross-sectional perspective view on the line A—A' in FIG. 3 of the floating-type semiconductor memory cell array in the fifth embodiment.
Figure 15:
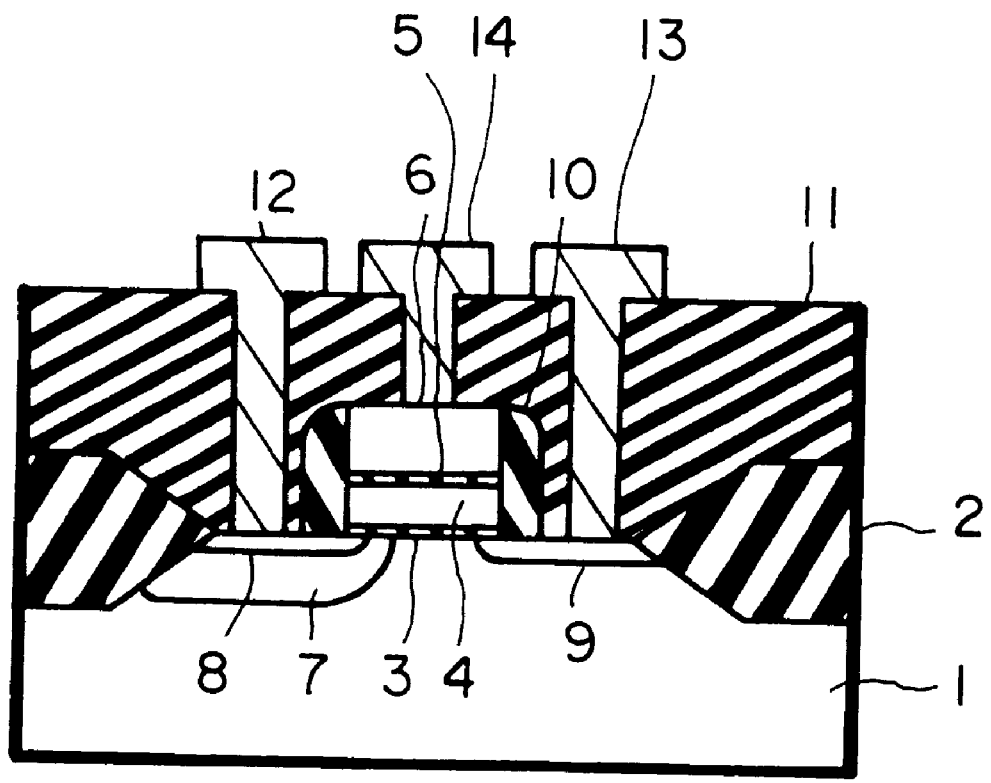
FIG. 15 is a cross section of a memory cell in a conventional non-volatile MOS semiconductor memory device.

A fifth embodiment of the present invention will be described below by referring to FIG. 14.

As for a structure, a first trench is formed shallower than the drain diffusion layer 28. As for the process, when the drain diffusion layer is extremely shallow, it is necessary to pay a great attention not to make the first trench deeper than the drain diffusion layer. As for device characteristics, when the aperture areas of the first and second trenches are called S1 and S2, the capacitance of the capacitor $C_3$ formed between the drain and the floating gate is larger by an amount corresponding to area difference (S1–S2) between both aperture areas. The capacitance of the capacitor $C_1$ formed between the epitaxial layer 25, where channels are formed, and the floating gate is smaller by an amount corresponding to the area difference (S1–S2) than the counterparts in the first embodiment. Incidentally, $C_2$ can be larger than $C_1$. These trends are desirable for the technical requirement to a floating-type semiconductor memory cell which allows high-speed writing and erasing operations, that is, both $C_2$ and $C_3$ are large and that $C_2 \gg C_4$.

The present invention is not limited only to NOR-type flash memory. As indicated by claim 1, the claimed invention provides a new memory cell comprising a single MOS transistor for high density memory device for many purposes.

What is claimed is:

1. A non-volatile semiconductor memory device including a plurality of MOS transistor memory cells operatively connected with bit lines, word lines, and source lines formed on a semiconductor substrate having a first conductivity type, each of the MOS transistor memory cells comprising:
   a source region having a second conductivity type opposite to the first conductivity type formed on the semiconductor substrate, the source region being electrically connected to a respective one of the source lines;
   a semiconductor region having a first conductivity type formed on the source region, the semiconductor region being electrically connected to the semiconductor substrate;
   a drain region having a second conductivity type formed on the semiconductor region, the drain region being electrically connected to a respective one of the bit lines;
   a trench penetrating the drain region and the semiconductor region, and extending to the source region;
   a first insulating film formed on an entire inside surface of the trench, wherein a channel region is formed in the semiconductor region between the source and drain regions beneath the first insulating film along a side wall of the trench;
   a first conductive layer formed on a surface of the first insulating film;
   a second insulating film formed on an entire surface of the first conductive layer so as to electrically isolate the first conductive layer in each of the memory cells; and
   a second conductive layer formed on a surface of the second insulating film, the second conductive layer electrically connected to a respective one of the word lines;
   wherein a peripheral width of an aperture of the trench in an upper surface of the drain region is larger than a peripheral width of an aperture of the trench in an upper surface of the source region.

2. A non-volatile semiconductor memory device according to claim 1, further comprising:
   a plurality of sections on the surface of the semiconductor substrate bounded by first parallel lines equally spaced from each other and second parallel lines equally spaced from each other crossing the first parallel lines, each of the sections being occupied by one of the memory cells;
   a vertical insulating wall disposed on each of the first parallel lines extending depthwise from an upper surface of the drain region to at least the lower surface of the source region so as to separate the source and drain regions in each of the memory cells from the source and drain regions in adjacent memory cells arranged in both sides in a direction of the second parallel lines, respectively, wherein the source regions are continuous over a series of the sections arranged between each pair of the vertical insulating walls adjacent to each other;
   a first leading electrode connecting the continuous source regions in each of a series of the sections to a corresponding one of the source lines; and
   a second leading electrode connecting to the drain region in each of the sections, a plurality of the second leading electrodes connected to the corresponding drain regions in the sections arranged in a series between each pair of the second parallel lines adjacent to each other being connected to a respective one of the bit lines.

3. A non-volatile semiconductor memory device according to claim 1, wherein the first conductive layer is a floating gate electrode insulated from the source, channel, and drain regions by the first insulating film, and the second conductive layer is a control gate electrode insulated from the floating gate electrode by the second insulating film.

4. A non-volatile semiconductor memory device according to claim 3, wherein electrostatic capacitance between the floating gate electrode and the control gate electrode is larger than electrostatic capacitance between the floating gate electrode and the source region.

5. A non-volatile semiconductor memory device according to claim 1, wherein the trench is deeper than a lower surface of the source region.

6. A non-volatile semiconductor memory device according to claim 1, wherein the peripheral width of an aperture of the trench at an upper surface of the drain region is larger than a peripheral width of an aperture of the trench at a lower surface of the drain region.

7. A non-volatile semiconductor memory device according to claim 3, wherein the first insulating film is thin enough to extract electrons from the floating gate electrode to the source region by Fowler-Nordheim tunneling under a condition that a control gate voltage for erasing is applied between the control gate electrode and the source region, and also thin enough to inject hot electrons into the floating gate electrode from the semiconductor layer near the drain region by Avalanche breakdown under a condition that a floating gate voltage for writing is applied between the floating gate electrode and the drain region.

* * * * *